United States Patent
Yamamoto et al.

(10) Patent No.: US 10,353,119 B2
(45) Date of Patent: Jul. 16, 2019

(54) METHOD FOR MANUFACTURING MOLD OR OPTICAL ELEMENT

(71) Applicant: NALUX CO., LTD., Osaka-shi, Osaka (JP)

(72) Inventors: Kazuya Yamamoto, Osaka (JP); Takeshi Yamamoto, Osaka (JP)

(73) Assignee: NALUX CO., LTD., Osaka-shi, Osaka (JP)

(*) Notice: Subject to any disclaimer, the term of this patent is extended or adjusted under 35 U.S.C. 154(b) by 0 days.

(21) Appl. No.: 15/808,321

(22) Filed: Nov. 9, 2017

(65) Prior Publication Data

US 2018/0088258 A1 Mar. 29, 2018

Related U.S. Application Data

(63) Continuation of application No. 14/663,746, filed on Mar. 20, 2015, which is a continuation-in-part of
(Continued)

(51) Int. Cl.
*G02B 5/02* (2006.01)
*H01L 21/3213* (2006.01)
(Continued)

(52) U.S. Cl.
CPC .......... *G02B 5/0294* (2013.01); *B29C 33/424* (2013.01); *C23F 4/00* (2013.01);
(Continued)

(58) Field of Classification Search
CPC ........ H01L 21/32132; H01L 21/32137; H01L 21/02071; G02B 3/0025
(Continued)

(56) References Cited

U.S. PATENT DOCUMENTS

| 8,187,481 B1 | 5/2012 | Hobbs |
| 8,649,096 B2 | 2/2014 | Yamamoto et al. |

(Continued)

FOREIGN PATENT DOCUMENTS

| JP | H09232482 A | 9/1997 |
| JP | 2002-22911 A | 1/2002 |

(Continued)

OTHER PUBLICATIONS

Sunlight, "Wikipedia, the Free Encyclopedia via https://web.archive.org/web/20121224144748/https://en.wikipedia.org/wiki/Sunlight", pp. 1-9, 2012. (No copy provided, per MPEP 609. U.S. Appl. No. 14/663,746).

(Continued)

*Primary Examiner* — Binh X Tran
(74) *Attorney, Agent, or Firm* — Squire Patton Boggs (US) LLP

(57) ABSTRACT

A method for manufacturing a mold or an optical element provided with a fine surface roughness for anti-reflection or for diffusing, may include placing a substrate or a film made of a semiconductor or a metal into a reacting etching apparatus, introducing a mixed gas of sulfur hexafluoride and oxygen into the etching apparatus with the substrate or the film, tuning the mixed gas into plasma such that oxides are made to be scattered on a surface of the substrate or the film, and etching the surface of the substrate of the film by the sulfur hexafluoride while the oxides function as an etching mask to form the fine surface roughness on the surface of the substrate or the film. Further, etching conditions may be determined such that the pitch of the fine surface roughness is made from 3 to 18 micrometers.

2 Claims, 21 Drawing Sheets

Related U.S. Application Data application No. PCT/JP2013/061889, filed on Apr. 23, 2013.

(60) Provisional application No. 61/727,284, filed on Nov. 16, 2012, provisional application No. 61/968,629, filed on Mar. 21, 2014.

(51) Int. Cl.
| | | |
|---|---|---|
| *H01L 21/02* | (2006.01) | |
| *B29C 33/42* | (2006.01) | |
| *C23F 4/00* | (2006.01) | |
| *G02B 1/118* | (2015.01) | |
| *B29C 33/56* | (2006.01) | |

(52) U.S. Cl.
CPC ........ *G02B 1/118* (2013.01); *H01L 21/02071* (2013.01); *H01L 21/32132* (2013.01); *H01L 21/32137* (2013.01); *B29C 33/56* (2013.01); *Y10T 428/24355* (2015.01)

(58) Field of Classification Search
USPC .............. 216/26, 75, 79; 438/719, 720, 742
See application file for complete search history.

(56) References Cited

U.S. PATENT DOCUMENTS

| | | | |
|---|---|---|---|
| 2003/0178057 A1 | 9/2003 | Fujii | |
| 2009/0274873 A1* | 11/2009 | Shinotsuka | B82Y 10/00 428/143 |
| 2010/0075114 A1 | 3/2010 | Kurihara et al. | |
| 2010/0258916 A1* | 10/2010 | Cousin | H01L 21/02005 257/620 |
| 2011/0069393 A1 | 3/2011 | Hamamura et al. | |
| 2011/0249338 A1 | 10/2011 | Endoh et al. | |
| 2012/0207275 A1* | 8/2012 | Teshima | C25D 5/022 378/62 |
| 2014/0113450 A1 | 4/2014 | Uda | |
| 2014/0302620 A1 | 10/2014 | Lee | |

FOREIGN PATENT DOCUMENTS

| | | |
|---|---|---|
| JP | 2005-303255 A | 10/2005 |
| JP | 2008-112036 A | 5/2008 |
| JP | 2009-128543 A | 6/2009 |
| JP | 2009-132010 A | 6/2009 |
| JP | 2010-013337 A | 1/2010 |
| JP | 2012-40878 A | 3/2012 |
| JP | 2012-078831 A | 4/2012 |
| JP | 2012078831 A | 4/2012 |
| JP | 2012-162450 A | 8/2012 |
| JP | 2014-051710 A | 3/2014 |
| WO | 2006/129514 A1 | 12/2006 |
| WO | 2009/125769 A1 | 10/2009 |
| WO | 2010/074190 A1 | 7/2010 |
| WO | 2012173122 A1 | 12/2012 |
| WO | 2013089473 A1 | 6/2013 |

OTHER PUBLICATIONS

Infrared, Wikipedia the Free Encyclopedia via "https://web.archive.org/web/20131013151148/https://en.wikipedia.org/wiki/infrared", pp. 1-12, 2013. (No copy provided, per MPEP 609. U.S. Appl. No. 14/663,746).

Japanese office Action patent application No. 2015-030437 dated Feb. 23, 2016. (No copy provided, per MPEP 609. U.S. Appl. No. 14/663,746).

International Seach Report and Written Opinion dated Aug. 20, 2013, corresponding to International Patent Application No. PCT/JP2013/061889 and partial English translation thereof. (No copy provided, per MPEP 609. U.S. Appl. No. 14/663,746).

2nd Japanese Office Action application No. 2015-030437 dated May 31, 2018.

Japanese Office Action issued in corresponding Japanese Patent Application No. 2016-185660 dated Nov. 13, 2018.

* cited by examiner

METHOD FOR MANUFACTURING MOLD OR OPTICAL ELEMENT

CROSS REFERENCE TO RELATED APPLICATION

This is a Continuation of co-pending U.S. patent application Ser. No. 14/663,746, filed on Mar. 20, 2015, which is a Continuation-in-Part of International Patent Application No. PCT/JP2013/061889 filed Apr. 23, 2013, which designates the U.S. and was published under PCT Article 21(2) in English, which claims priority from U.S. Provisional Patent Application No. 61/727,284, dated Nov. 16, 2012. U.S. patent application Ser. No. 14/663,746 also claims priority from U.S. Provisional Patent Application No. 61/968,629 filed on Mar. 21, 2014. The contents of these applications are hereby incorporated by reference.

BACKGROUND

Field

The present invention relates to a method for manufacturing a mold or an optical element provided with a fine surface roughness, the mold and the optical element.

Description of the Related Art

Anti-reflective structures having grating shapes, the pitch (or the period) of the grating being smaller than the wavelength of light, are used in optical elements. As a method for manufacturing molds for such anti-reflective structures, a method in which a resist undergoes patterning by interference exposure or using an electron-beam lithography system and then etching or electroforming is carried out is known (for example, WO2006/129514).

By the method in which an electron-beam lithography system is used, a pattern with a fine pitch can be formed, and lithography or pattern forming on curved surfaces can be realized. However, the required manufacturing time excessively increases as an area in which pattern is to be formed increases. Accordingly, from a practical standpoint, the maximum area in which pattern can be formed is 10 mm square at most.

The method in which interference exposure is used carries an advantage that a large area can be patterned at a time, but in the method the resolution is restricted. Thus, the pitch cannot be made highly fine. Further, when the method is applied to patterning on curved surfaces, degree of flexibility in design is low. Accordingly, there has been a problem that anti-reflection property deteriorates in the lower wavelength area of visible light.

Thus, methods in which patterning is used are complicated in process and are time-consuming.

On the other hand, a method for manufacturing a mold for an anti-reflective structure, which does not require patterning, has been developed (for example, U.S. Pat. No. 8,187,481B1).

However, the method described in U.S. Pat. No. 8,187,481B1 has a problem when the method is applied to manufacture a high-performance anti-reflective structure. Concerning the problem, description will be given later in comparison with the present invention.

Further, black silicon for solar cells has been already developed. However, the technical field of black silicon and that of molds for optical elements completely differ from each other. The both are irrelevant to each other, and there is nothing that suggests some relationship between the both.

Recently, other methods for manufacturing anti-reflective structures without the necessity of patterning process of resist have been developed. Among the methods, there are a method in which a fine surface roughness is formed by coating nanoparticles on a surface of a substrate (for example, JP2012-40878) and a method in which a fine surface roughness is formed using anodic oxidation porous alumina as a mold (for example, JP2014-51710). These methods are supposed to be applied to a surface having a large area or a curved surface. However, because of the properties of the manufacturing methods, pitch of the surface roughness is restricted to 1 micrometer or less. Accordingly, the surface roughness can hardly be applied to optical elements functioning with infrared rays, for example.

Thus, a method for manufacturing a mold or an optical element by which fine surface roughness having pitches of a wide range including infrared region can be formed on a surface having a large area or on a curved surface, has not been developed.

Accordingly, there is a need for a method for manufacturing a mold or an optical element by which fine surface roughness having pitches of a wide range including infrared region can be formed on a surface having a large area or on a curved surface.

SUMMARY

A method for manufacturing a mold or an optical element provided with a fine surface roughness for anti-reflection or for diffusing, according to an embodiment of the present invention may include placing a substrate or a film made of a semiconductor or a metal into a reactive etching apparatus. The method may also include introducing a mixed gas of sulfur hexafluoride and oxygen into the etching apparatus with the substrate or the film. The method may further include tuning the mixed gas into plasma such that oxides are made to be scattered on a surface of the substrate or the film. In addition, the method may include etching the surface of the substrate of the film by the sulfur hexafluoride while the oxides function as an etching mask to form the fine surface roughness on the surface of the substrate or the film. Further, etching conditions may be determined such that the pitch of the fine surface roughness is made from 3 to 18 micrometers.

According to the present embodiment, a mold or an optical element provided with a fine surface roughness can be manufactured by a simplified process without the necessity of patterning process for an etching mask. Further, a mold or an optical element provided with a fine surface roughness having a pitch in a wide range including a visible light region and an infrared region can be obtained.

A mold according to another embodiment of the present invention, is manufactured by the method described in the above-described first embodiment.

In a mold according to another embodiment of the present invention, the fine surface roughness on the mold is used to form an anti-reflective structure.

In a mold according to another embodiment of the present invention, the fine surface roughness on the mold is used to form a diffusing structure.

An optical element according to another embodiment of the present invention, is manufactured by the method described in the above-described first embodiment.

DETAILED DESCRIPTION

Figure 1:
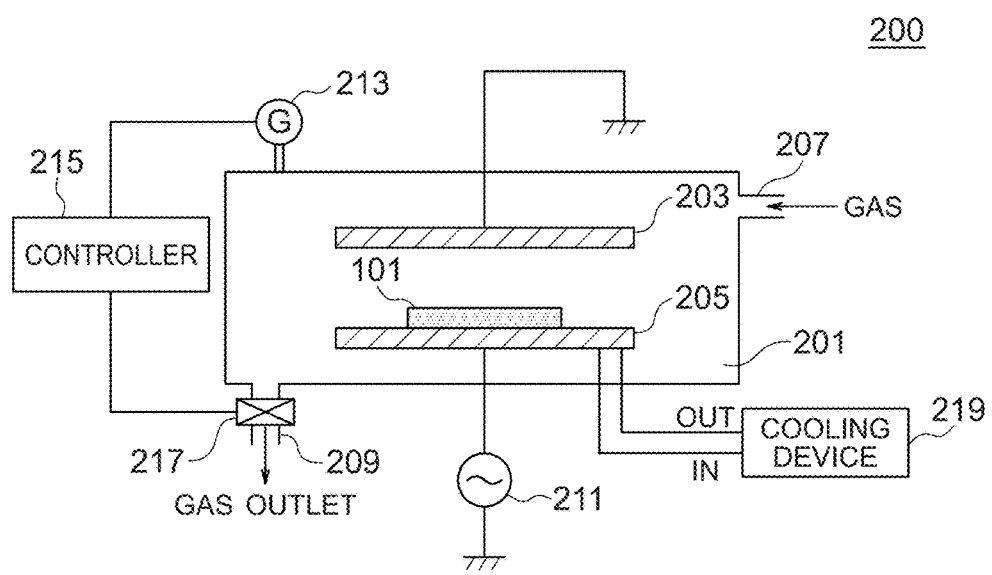
FIG. 1 shows a construction of a reactive ion etching apparatus used for a method for manufacturing a mold or an optical element having a surface roughness.

FIG. 1 shows a construction of a reactive ion etching apparatus 200 used for manufacturing a mold or an optical element having a surface roughness. The reactive ion etching apparatus 200 has an etching chamber 201. Gases are fed to the evacuated etching chamber 201 through a gas feed port 207. The etching chamber 201 is further provided with a gas exhaust port 209 to which a valve 217 is attached. The gas pressure in the etching chamber 201 can be controlled to a desired value by a controller 215 which is configured to manipulate the valve 217 according to a measurement of a gas pressure gauge 213 installed at the etching chamber 201. An upper electrode 203 and a lower electrode 205 are provided in the etching chamber 201. Plasma can be generated by applying high frequency voltage between the both electrodes using high frequency power supply 211. On the lower electrode 205 a substrate 101 which is a base material of a mold is placed. The lower electrode 205 can be cooled at a desired temperature by a cooling device 219. The cooling device 219 may be a water-cooling chiller, for example. The reason that the lower electrode 205 is cooled is to control the etching reaction by keeping the temperature of the substrate 101 at a desired value.

The gas to be fed to the etching chamber 201 is a mixture of sulfur hexafluoride gas and oxygen gas. The material of the substrate is a semiconductor or a metal which reacts with sulfur hexafluoride.

Figure 2:
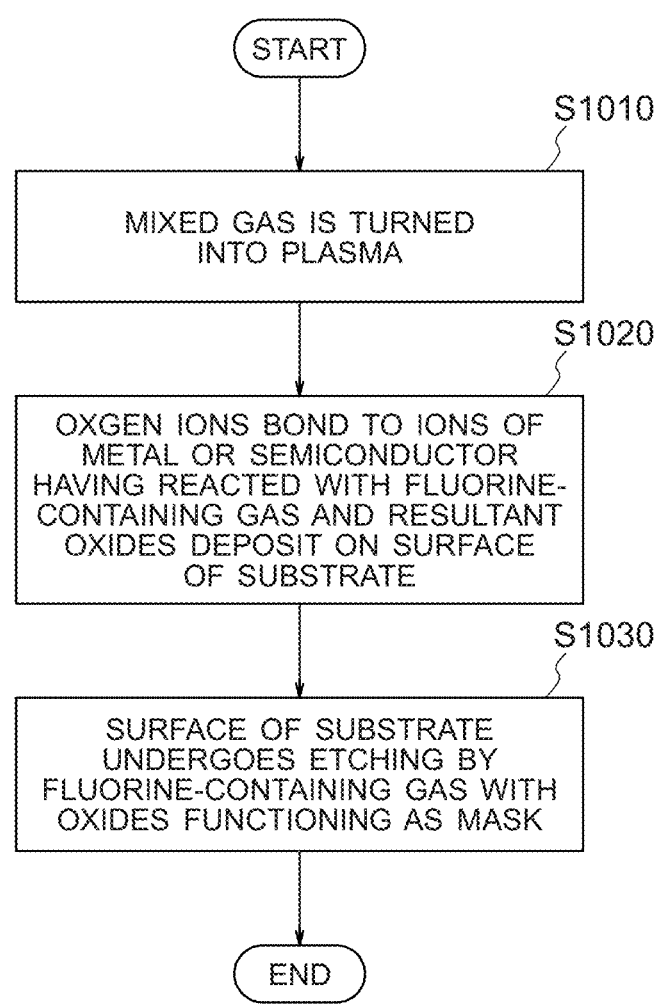
FIG. 2 is a flowchart for illustrating the principle of a method for manufacturing a mold for anti-reflective structure according to the present invention.

FIG. 2 is a flowchart for illustrating the principle of a method for manufacturing a mold for anti-reflective structure according to an embodiment of the present invention.

In step S1010 of FIG. 2, a high frequency voltage is applied to the mixture of gases such that it is turned into plasma to carry out plasma dry etching.

In step S1020 of FIG. 2, oxygen ions in the plasma bind to ions of the metal or the semiconductor of the substrate, which have reacted with the fluorine-containing gas (sulfur hexafluoride gas), resultant oxides deposit at random positions on the surface of the substrate. The above-described oxides are hardy etched by sulfur hexafluoride, and therefore function as an etching mask.

In step S1030 of FIG. 2, portions on the surface of the substrate, which are not covered with the oxides undergo etching while the oxides function as a mask. As a result, a surface roughness is formed on the surface of the substrate.

As described above, the used gas is a mixture of sulfur hexafluoride ($SF_6$) gas and oxygen gas.

The material of the substrate is a semiconductor or a metal which reacts with sulfur hexafluoride. More specifically, the material is silicon, titanium, tungsten, tantalum, a titanium alloy which is made by adding other elements to titanium, a tungsten alloy which is made by adding other elements to tungsten, or the like.

Figure 3A:
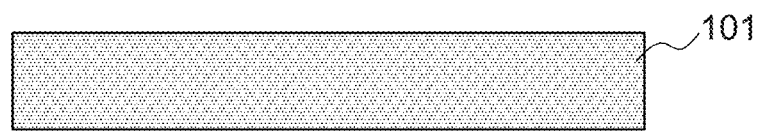
FIGS. 3A and 3B illustrate a method for manufacturing a mold having a fine surface roughness on a flat surface.
Figure 3B:
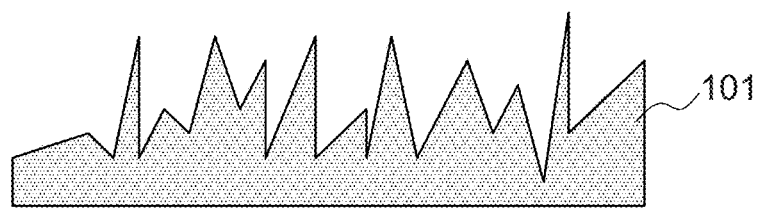

FIGS. 3A and 3B illustrate a method for manufacturing a mold having a fine surface roughness on a flat surface.

FIG. 3A shows a cross section of a substrate 101 to which etching has not been carried out.

FIG. 3B shows a cross section of the substrate 101 which is provided with a fine surface roughness. The fine surface roughness has been formed by etching carried out using the reactive ion etching apparatus. In FIG. 3B, the size of the fine surface roughness is displayed in an enlarged view in comparison with the substrate for the sake of easier understanding.

Figure 4A:
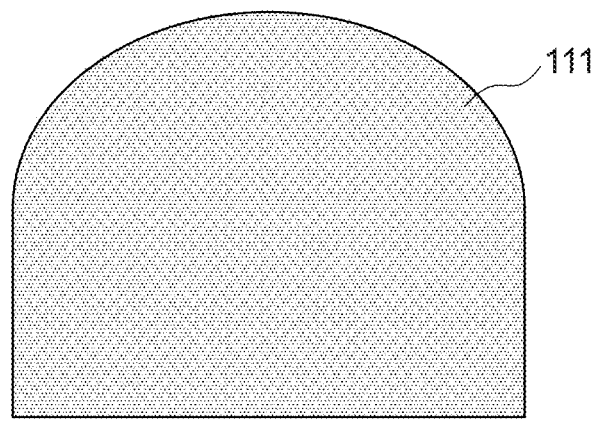
FIGS. 4A and 4B illustrate a method for manufacturing an optical element having a fine surface roughness.
Figure 4B:
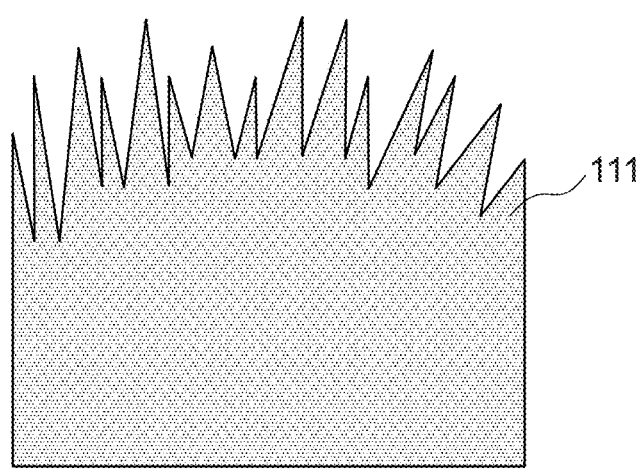

FIGS. 4A and 4B illustrate a method for manufacturing an optical element having a fine surface roughness.

FIG. 4A shows a cross section of an optical element made of silicon. The optical element has a curved surface, which has been shaped by cutting or the like. The optical element made of silicon is used for infrared rays.

FIG. 4B shows a cross section of the optical element made of silicon, which is provided with a fine surface roughness. The fine surface roughness has been formed by etching carried out using the reactive ion etching apparatus. The fine surface roughness of the optical element functions as an anti-reflective structure. In FIG. 4B, the size of the fine surface roughness is displayed in an enlarged view in comparison with the optical element for the sake of easier understanding.

Figure 5:
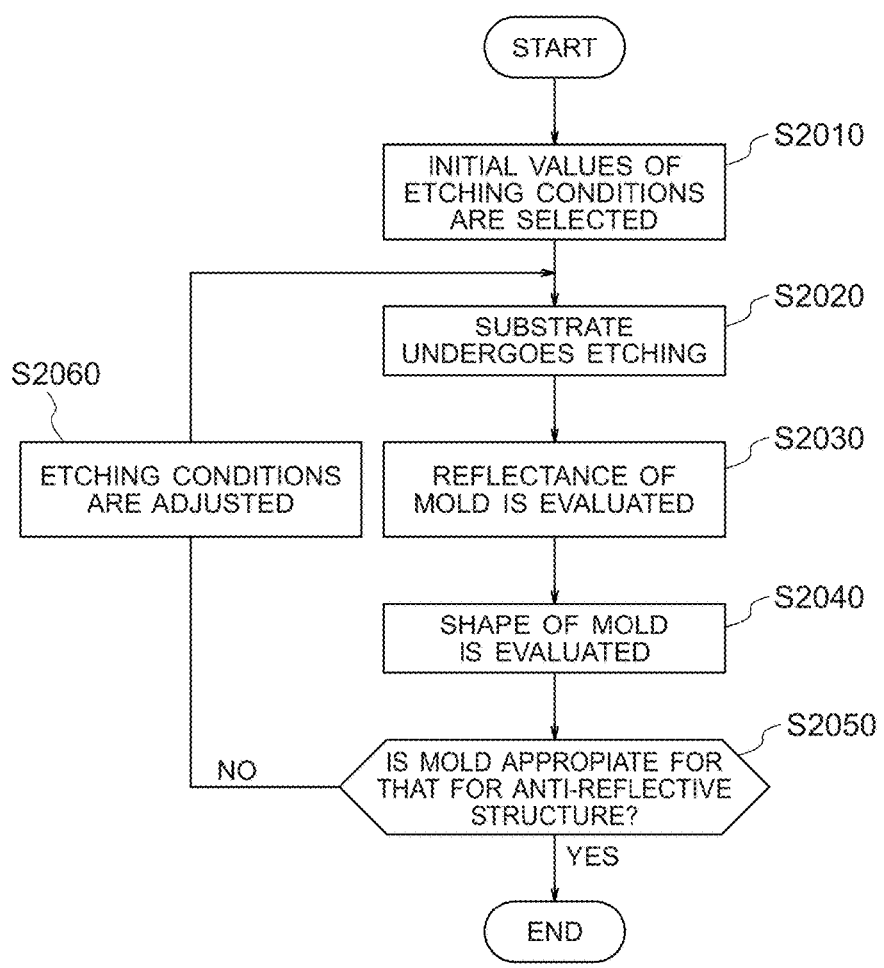
FIG. 5 is a flowchart for determining etching conditions of a method for manufacturing a mold for anti-reflective structure as an example of the method for manufacturing a mold according to the present invention.

FIG. 5 is a flowchart for determining etching conditions of a method for manufacturing a mold for anti-reflective structure as an example of the manufacturing method according to the present invention.

In step S2010 in FIG. 5, initial values of the etching conditions are selected.

In step S2020 in FIG. 5, etching is carried out on the substrate under the selected etching conditions using the reactive ion etching apparatus.

In step S2030 in FIG. 5, a reflectance of the manufactured mold is evaluated.

In step S2040 in FIG. 5, a shape of the manufactured mold is evaluated. The shape is evaluated using a scanning electron microscope, for example.

In step S2050 in FIG. 5, it is determined whether or not the manufactured mold is appropriate for a mold for anti-reflective structure. If the manufactured mold is appropriate, the process is terminated. If the manufactured mold is not appropriate, the process goes to step S2060.

In step S2060 in FIG. 5, the etching conditions are adjusted.

The etching conditions will be described in detail below. Table 1 shows some of the etching conditions.

TABLE 1

| Operation pressure | Mixture ratio of SF$_6$ and O$_2$ | Cooling temperature |
|---|---|---|
| 1 Pa | 50 mL/min:50 mL/min | 3° C. |

Into the etching chamber 201 of the reactive etching apparatus 200, the mixed gas of sulfur hexafluoride and oxygen is fed. An amount of feed of sulfur hexafluoride and that of oxygen are 50 milliliters per minute respectively. The pressure in the etching chamber 201 is controlled at 1 pascal. The temperature of the lower electrode 205 on which the substrate 101 is set is controlled at 3 degrees centigrade. The substrate 101 is made of silicon.

Figure 6:
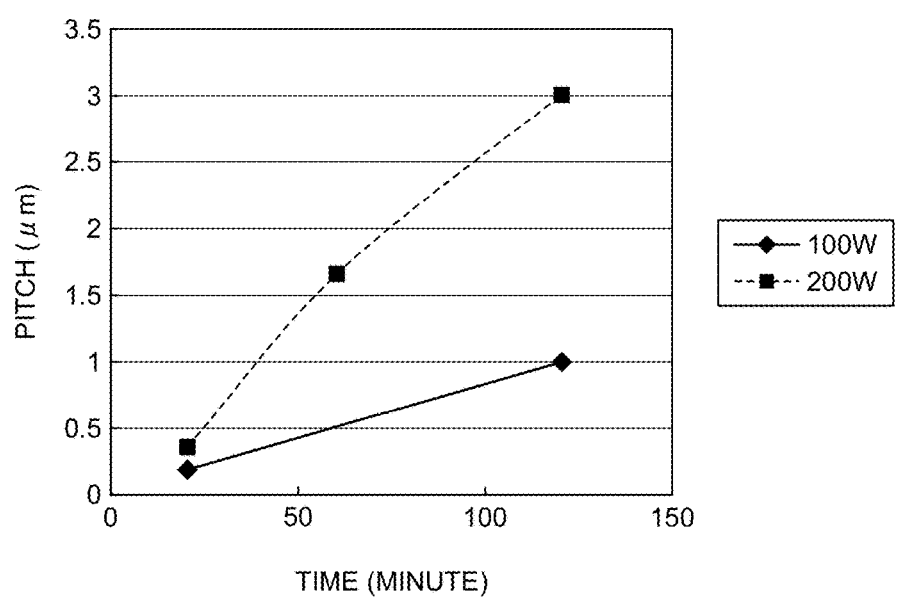
FIG. 6 shows a relationship between etching time and pitch of the fine surface roughness in the case that the power of the high frequency power supply is set to 100 watts and the etching conditions shown in Table 1 are maintained and a relationship between etching time and pitch of the fine surface roughness in the case that the power of the high frequency power supply is set to 200 watts and the etching conditions shown in Table 1 are maintained.

FIG. 6 shows a relationship between etching time and pitch of the fine surface roughness in the case that the power of the high frequency power supply 211 is set to 100 watts and the etching conditions shown in Table 1 are maintained, and a relationship between etching time and pitch of the fine surface roughness in the case that the power of the high frequency power supply 211 is set to 200 watts and the etching conditions shown in Table 1 are maintained. The horizontal axis in FIG. 6 represents etching time while the vertical axis in FIG. 6 represents pitch of the fine surface roughness. The unit of time is minute and the unit of pitch is micrometer. The frequency of the high frequency power supply 211 is 13.56 MHz.

Pitch of the fine surface roughness is an average of distance in the direction parallel to the substrate surface between adjacent convex portions or between adjacent concave portions in a cross section of the fine surface roughness. The view of the cross section can be obtained by an atomic force microscope or the like. The pitch can be obtained through Fourier analysis of the cross section shape of the fine surface roughness.

According to FIG. 6, pitch of the fine surface roughness increases with etching time. Further, rate of increase of pitch against time increases with power of the high frequency power supply 211.

Figure 7:
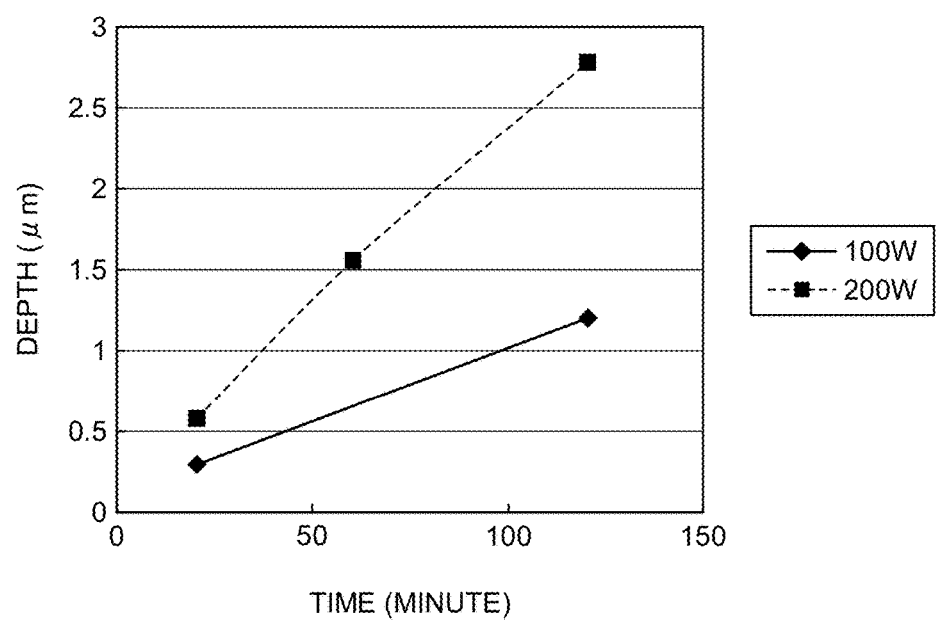
FIG. 7 shows a relationship between etching time and depth of the fine surface roughness in the case that the power of the high frequency power supply is set to 100 watts and the etching conditions shown in Table 1 are maintained and a relationship between etching time and depth of the fine surface roughness in the case that the power of the high frequency power supply is set to 200 watts and the etching conditions shown in Table 1 are maintained.

FIG. 7 shows a relationship between etching time and depth of the fine surface roughness in the case that the power of the high frequency power supply 211 is set to 100 watts and the etching conditions shown in Table 1 are maintained, and a relationship between etching time and depth of the fine surface roughness in the case that the power of the high frequency power supply 211 is set to 200 watts and the etching conditions shown in Table 1 are maintained. The horizontal axis in FIG. 7 represents etching time while the vertical axis in FIG. 7 represents depth of the fine surface roughness. The unit of time is minute and the unit of depth is micrometer.

Depth of the fine surface roughness is an average of distance in the direction perpendicular to the substrate surface between adjacent convex and concave portions in a cross section of the fine surface roughness.

According to FIG. 7, depth of the fine surface roughness increases with etching time. Further, rate of increase of depth against time increases with power of the high frequency power 211.

As described above, by adjusting the etching conditions including power of the high frequency power supply 211 and etching time, fine surface roughness having pitches and depths which correspond to visible light region and infrared region can be manufactured.

Figure 8:
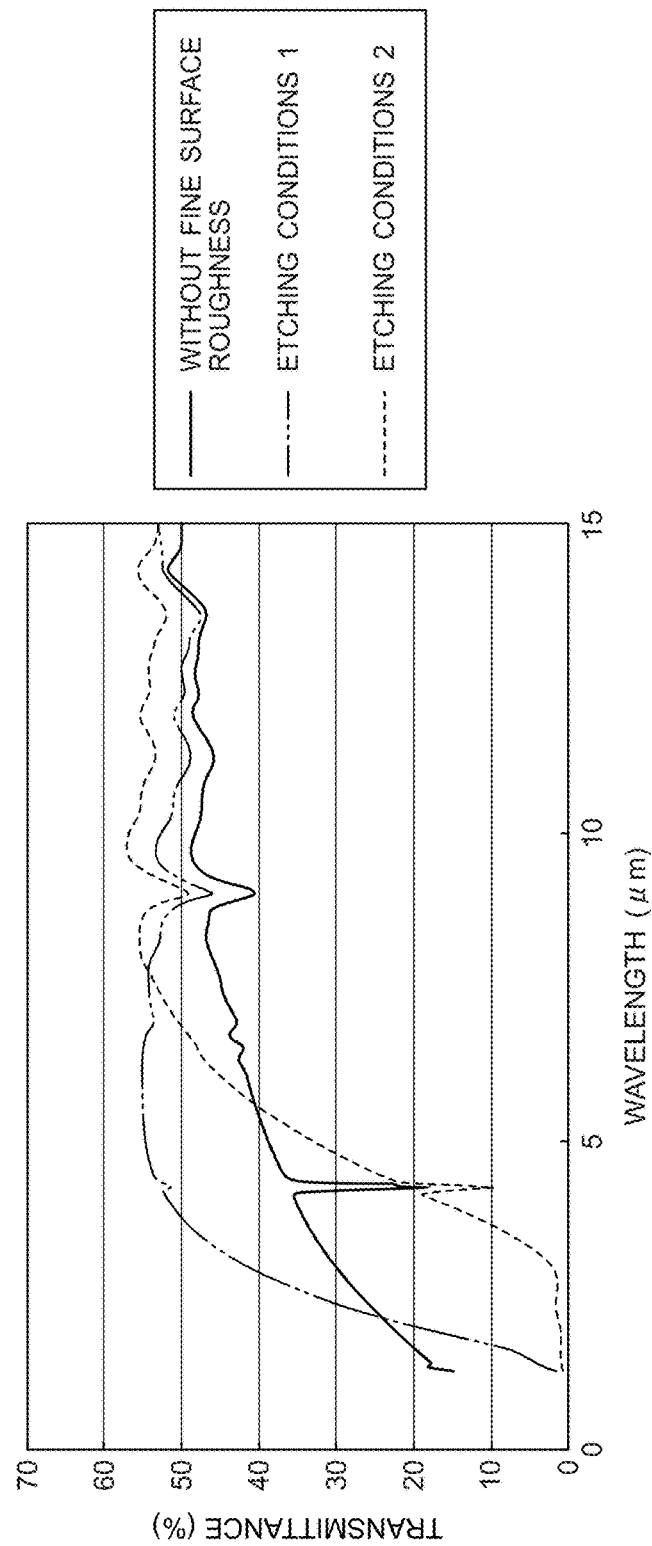
FIG. 8 shows relationships between wavelength and transmittance of infrared rays which enter substrates having different types of surface roughness.

FIG. 8 shows relationships between wavelength and transmittance of infrared rays which enter substrates having different types of surface roughness. The horizontal axis in FIG. 8 represents wavelength of the infrared rays which enter the substrates while the vertical axis in FIG. 8 represents transmittance of the infrared rays. In FIG. 8 the solid line represents the relationship between wavelength and transmittance of infrared rays which enter a substrate without fine surface roughness. In FIG. 8 the two-dotted line represents the relationship between wavelength and transmittance of infrared rays which enter the substrate having the fine surface roughness which has been manufactured under the etching conditions 1 which will be described below. In FIG. 8 the dashed line represents the relationship between wavelength and transmittance of infrared rays which enter the substrate having the fine surface roughness which has been manufactured under the etching conditions 2 which will be described below.

Figure 9:
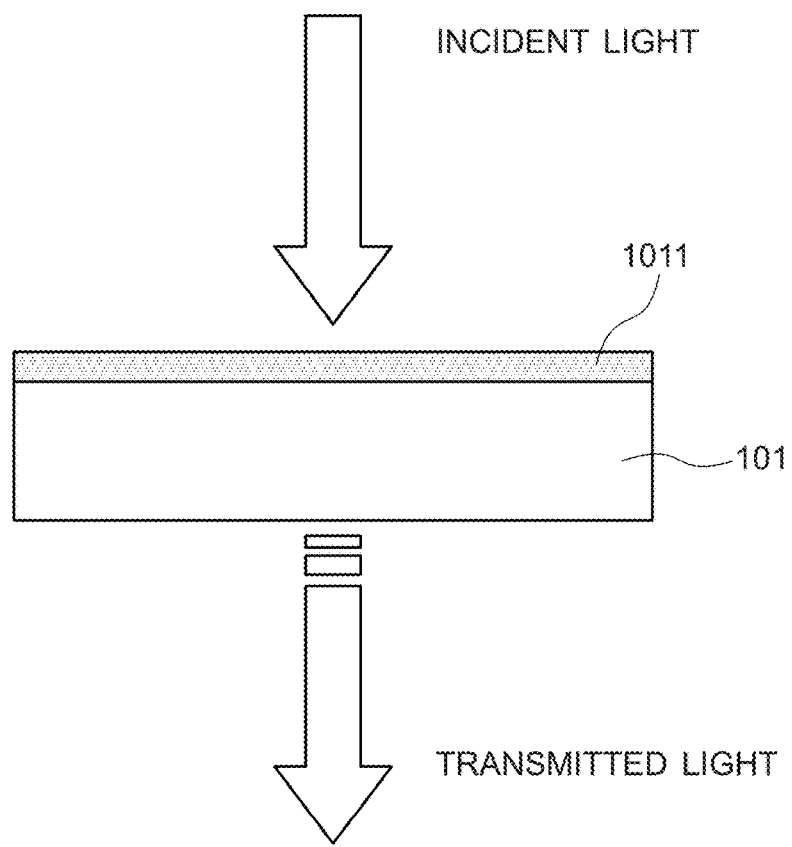
FIG. 9 illustrates transmittance.

FIG. 9 illustrates transmittance. Transmittance is a ratio of an amount of transmitted light to an amount of the incident light. The transmittance changes by the function of the fine surface roughness 1011 of the substrate 101.

Table 2 shows the etching conditions 1 and the etching conditions 2.

TABLE 2

| Etching conditions | Operation pressure | Mixture ratio of SF$_6$ and O$_2$ | Power | Time | Cooling temperature |
|---|---|---|---|---|---|
| 1 | 1 Pa | 50 mL/min: 50 mL/min | 100 W | 120 minutes | 3° C. |
| 2 | 1 Pa | 50 mL/min: 50 mL/min | 200 W | 120 minutes | 3° C. |

The fine surface roughness which has been manufactured under the etching conditions 1 will be hereinafter referred to as the fine surface roughness 1. The pitch of the fine surface roughness 1 is 1.0 micrometer while the depth of the fine surface roughness 1 is 1.21 micrometers. The ratio of pitch to depth of the fine surface roughness 1 is 0.83. The fine surface roughness which has been manufactured under the etching conditions 2 will be hereinafter referred to as the fine surface roughness 2. The pitch of the fine surface roughness 2 is 3.0 micrometer while the depth of the fine surface roughness 2 is 2.79 micrometers. The ratio of pitch to depth of the fine surface roughness 2 is 1.1.

According to FIG. 8, transmittance of the substrate having the fine surface roughness 1 is higher than that of the substrate without fine surface roughness in the wavelength range from 2 to 15 micrometers. Particularly, in the wavelength range from 3 to 7 micrometers, transmittance of the substrate having the fine surface roughness 1 is higher than that of the substrate without fine surface roughness by 10% or more. Transmittance of the substrate having the fine surface roughness 2 is higher than that of the substrate without fine surface roughness in the wavelength range from 6 to 15 micrometers. Particularly, in the wavelength range from 7 to 12 micrometers, transmittance of the substrate having the fine surface roughness 2 is higher than that of the substrate without fine surface roughness by 7% or more. From the above, the pitch of fine surface roughness for increasing transmittance, that is, reducing reflectance should be from one fifth (⅕) to one half (½) of the wavelength of light transmittance of which is to be increased.

Figure 10:
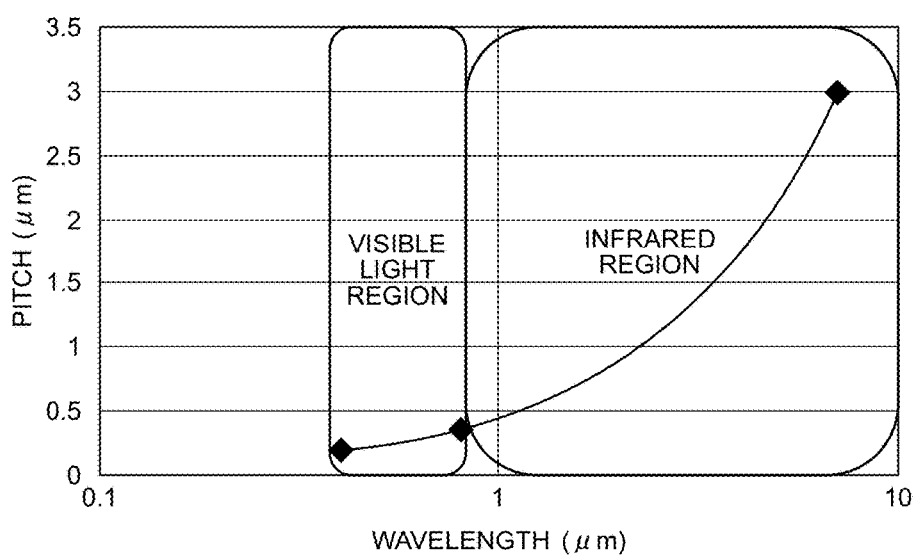
FIG. 10 shows a relationship between wavelength of light transmittance of which is to be increased and pitch of fine surface roughness for increasing the transmittance.

FIG. 10 shows an example of a relationship between wavelength of light transmittance of which is to be increased and pitch of fine surface roughness for increasing the transmittance. The horizontal axis in FIG. 10 represents wavelength of light transmittance of which is to be increased while the vertical axis in FIG. 10 represents pitch of fine surface roughness for increasing the transmittance.

Fine surface roughness having a pitch which is larger than that of the fine surface roughness 2 was manufactured. The fine surface roughness will be hereinafter referred to as fine surface roughness 3.

Table 3 shows the etching conditions for the fine surface roughness 3.

TABLE 3

| Operation pressure | Mixture ratio of SF$_6$ and O$_2$ | Power | Time | Cooling temperature |
|---|---|---|---|---|
| 1 Pa | 50 mL/min: 40 mL/min | 300 W | 120 minutes | 3° C. |

The pitch of the fine surface roughness 3 is 18.0 micrometers while the depth of the fine surface roughness 3 is 6.0 micrometers. The ratio of pitch to depth of the fine surface roughness 3 is 3.0.

In the etching conditions shown in Table 3, the amount of feed of oxygen is smaller than that of sulfur hexafluoride. As a result, distances between oxides which are deposited on the substrate surface and function as an etching mask become greater. Accordingly, the ratio of pitch to depth of the fine surface roughness 3 becomes greater than those of the fine surface roughness 1 and the fine surface roughness 2. As described above, by changing the ratio of the amount of feed of sulfur hexafluoride and the amount of feed of oxygen, the ratio of pitch to depth of the fine surface roughness can be changed.

Figure 11:
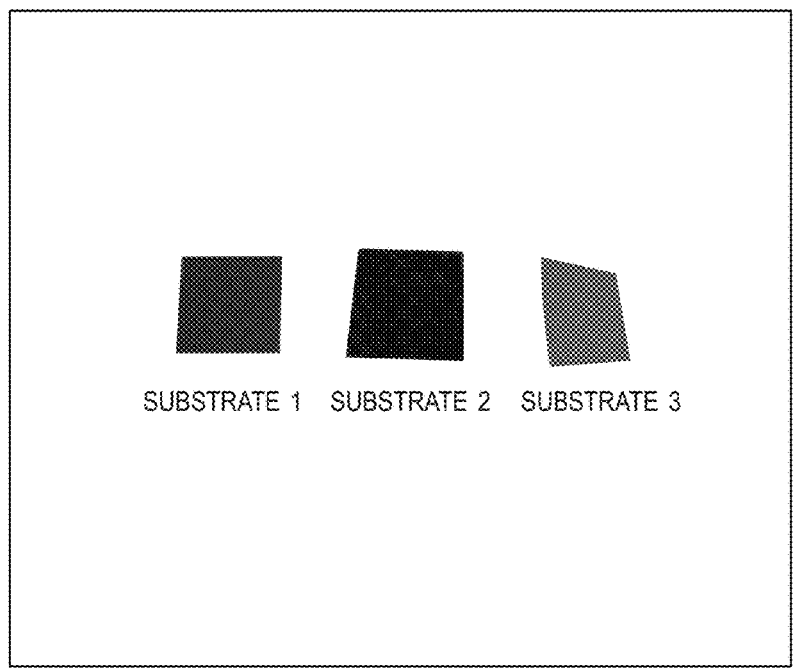
FIG. 11 shows a photo of the substrate 1 without a fine surface roughness, the substrate 2 with a fine surface roughness for visible light, and the substrate with the fine surface roughness 3.

FIG. 11 shows a photo of the substrate 1 without a fine surface roughness, the substrate 2 with a fine surface roughness for visible light, and the substrate with the fine surface roughness 3. The pitch of the fine surface roughness of the substrate 2 is 0.2 micrometers. Reflection on the surface of the substrate 2 is reduced by the fine surface roughness, and therefore the substrate 2 looks darker than the substrate 1. The pitch of the fine surface roughness 3 is much greater than wavelengths of the visible light. On the other hand, values of distance in the direction parallel to the substrate surface between adjacent convex portions or between adjacent concave portions are not constant and are distributed in a predetermined range. Accordingly, the fine surface roughness 3 of the substrate 3 causes diffracted lights of various orders of diffraction and of various wavelengths, and thus the substrate 3 looks more whitish than the substrate 1. This means that the substrate 3 with the fine surface roughness 3 causes diffusion of the visible light.

Thus, the substrate 3 with the fine surface roughness 3 functions as a diffuser plate. Thus, a mold for a diffusing structure is obtained.

Figure 12:
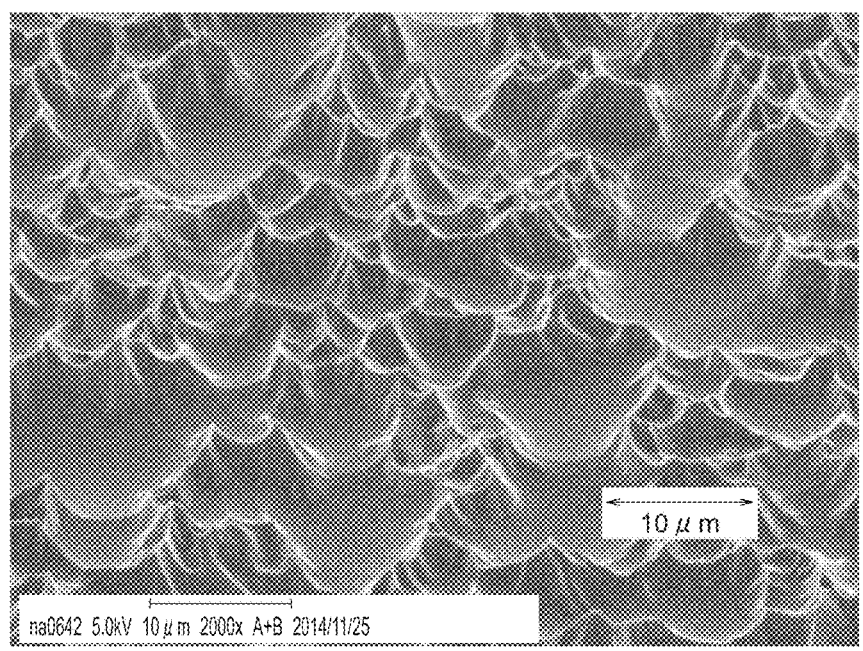
FIG. 12 shows a scanning electron microscope photo of the fine surface roughness 3.

FIG. 12 shows a scanning electron microscope photo of the fine surface roughness 3.

A method for manufacturing a mold for anti-reflective structure according to the present invention will be described using another example. A silicon wafer is used as the substrate.

Table 4 shows characteristics of the silicon wafer used in the example.

TABLE 4

| Type of electric conductivity | N or P |
|---|---|
| Dopant | Phosphorus or Boron |
| Crystallographic axis | (100) ± 1.0° |
| Resistivity | 1.0-10.0 Ω · cm |

Table 5 shows etching conditions in the example.

TABLE 5

| Gas pressure | Feed of SF6 | Feed of oxygen | High frequency power (RF power) | Cooling temperature | Reaction time |
|---|---|---|---|---|---|
| 2 Pa | 50 ml/min | 50 ml/min | 200 W | 5° C. | 20 minutes |

The frequency of the high frequency power is 13.56 MHz and the voltage is 200 V.

The pitch of the fine structure of the mold for anti-reflective structure manufactured by the above-described manufacturing conditions is approximately 0.2 micrometers while the depth thereof is approximately 0.3 micrometers. The aspect ratio is approximately 1.5.

Figure 13:
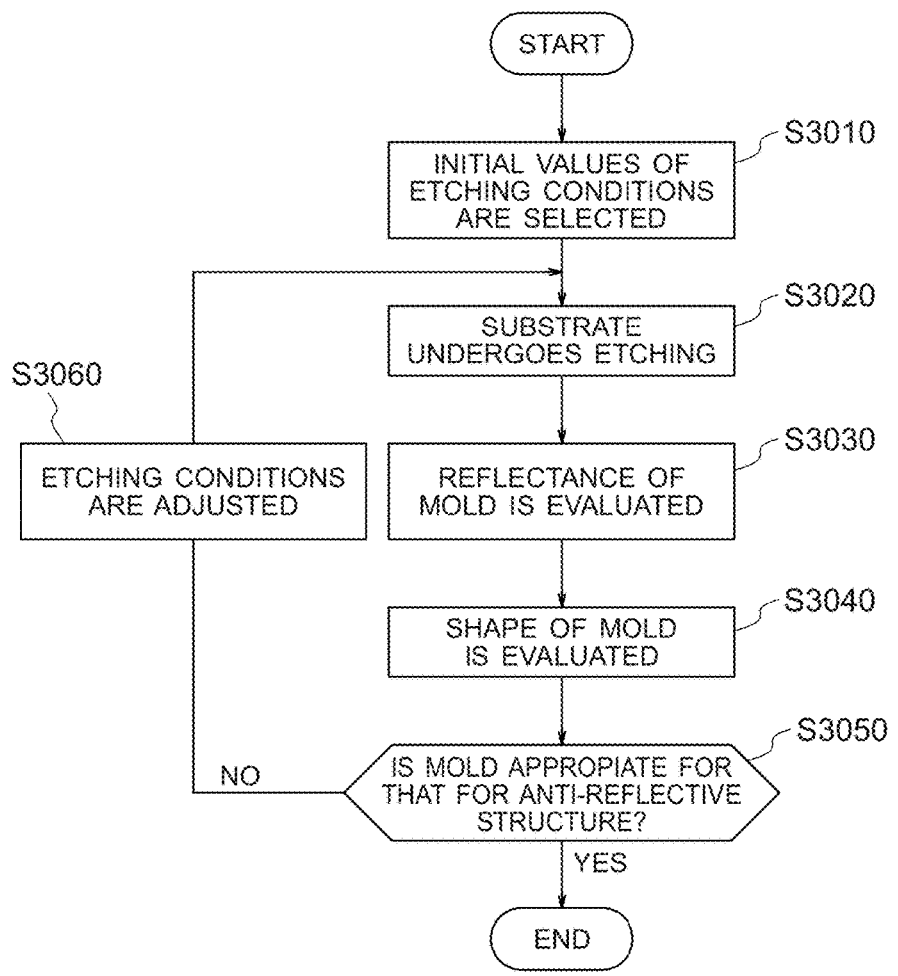
FIG. 13 is a flowchart for determining etching conditions of the a method for manufacturing a mold for anti-reflective structure according to the present invention.

FIG. 13 is a flowchart for determining etching conditions of the method for manufacturing a mold for anti-reflective structure according to the present invention.

In step S3010 in FIG. 13, initial values of the etching conditions are selected. More specifically, for example, the values shown in Table 5 are selected.

In step S3020 in FIG. 13, etching is carried out on the substrate under the selected etching conditions using the reactive ion etching apparatus.

In step S3030 in FIG. 13, a reflectance of the manufactured mold is evaluated.

In step S3040 in FIG. 13, a shape of the manufactured mold is evaluated. The shape is evaluated using a scanning electron microscope, for example.

In step S3050 in FIG. 13, it is determined whether or not the manufactured mold is appropriate for a mold for anti-reflective structure. If the manufactured mold is appropriate, the process is terminated. If the manufactured mold is not appropriate, the process goes to step S3060.

In step S3060 in FIG. 13, the etching conditions are adjusted. How to adjust the etching conditions will be described below.

The aspect ratio of the fine structure should be 0.8 or more. In order to change the aspect ratio, a ratio of partial pressures of the gasses, the cooling temperature of the substrate, and etching time are mainly adjusted. When the partial pressure of $SF_6$ gas in the mixed gas is raised, the etching rate becomes higher. When the cooling temperature of the substrate is lowered, the reaction for generating silicon oxide (SiO) is promoted, and therefore formation of coated portions for preventing etching (the mask) is promoted. Accordingly, when the etching time (reaction time) is increased under the above-described conditions, the aspect ratio becomes greater.

The pitch of the fine structure should be 0.35 micrometers or less such that the pitch is smaller than wavelengths of the visible light. In order to change the pitch of the fine structure, a ratio between partial pressures of the gasses and the cooling temperature of the substrate are adjusted. When the ratio of partial pressure of oxygen is raised and the cooling temperature of the substrate is lowered, the pitch of the fine structure becomes smaller.

Functions of various parameters can be summarized as below.

When the ratio of partial pressure of sulfur hexafluoride ($SF_6$) in the mixed gas is raised, the etching rate becomes higher.

When the cooling temperature of the substrate is lowered, the reaction for generating silicon oxide (SiO) is promoted, and therefore formation of coated portions for preventing etching (the mask) is promoted.

When reaction time is increased, etching is promoted.

When the gas pressure of the mixed gas is raised, the etching rate becomes higher.

When the power of the high frequency power supply is raised, the etching rate becomes higher.

However, when the ratio of partial pressure of sulfur hexafluoride ($SF_6$) in the mixed gas is too high, silicon oxide (SiO) is not generated, and therefore coated portions for preventing etching (the mask) are not formed. Accordingly, the grating like structure is not formed. Further, when the ratio of partial pressure of oxygen in the mixed gas is too high, or the cooling temperature of the substrate is too low, coated portions for preventing etching (the mask) are excessively generated, and therefore etching is not carried out. Accordingly, the grating like structure is not formed.

Accordingly, the above-described various parameters should be adjusted in predetermined ranges.

Table 6 shows the ranges of adjustment of the various parameters in the above-described case (in which the material of the substrate is silicon and the mixed gas includes sulfur hexafluoride ($SF_6$) and oxygen).

TABLE 6

| Gas pressure | Ratio of oxygen in mixed gas | High frequency power (RF power) | Cooling temperature | Reaction time |
|---|---|---|---|---|
| 1-5 Pa | 30-70% | 50-5000 W | 30° C. or less | 5-300 minutes |

Table 7 shows the ranges of adjustment of the various parameters in the case in which the material of the substrate is one of titanium, tungsten, tantalum, a titanium alloy which is made by adding other elements to titanium, and a tungsten alloy which is made by adding other elements to tungsten silicon and the mixed gas includes sulfur hexafluoride ($SF_6$) and oxygen.

TABLE 7

| Gas pressure | Ratio of oxygen in mixed gas | High frequency power (RF power) | Cooling temperature | Reaction time |
|---|---|---|---|---|
| 1-5 Pa | 30-70% | 50-5000 W | 30° C. or less | 5-600 minutes |

An advantage of the case in which silicon is used as the material of the substrate is that machining is easier, while an advantage of the case in which a metal is used as the material of the substrate is that the mold is superior in durability.

In the above-described embodiment, the mixed gas of sulfur hexafluoride and oxygen is used. In place of sulfur hexafluoride, other fluorine-containing gases (carbon tetrafluoride, trifuluoromethane and the like) can also be used.

Figure 14A:
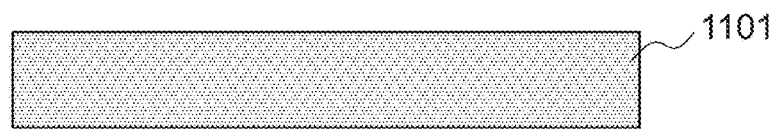
FIGS. 14A and 14B illustrate how a mold for anti-reflective structure is formed on a flat surface.
Figure 14B:
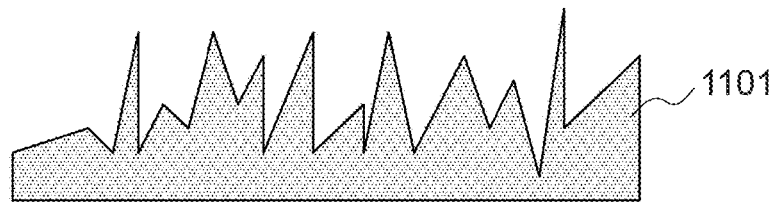

FIGS. 14A and 14B illustrate how a mold for anti-reflective structure is formed on a flat surface.

FIG. 14A shows a cross section of the substrate 1101 to which etching has not been carried out.

FIG. 14B shows a cross section of the substrate 1101 which is provided with a shape of anti-reflective structure on a surface. The shape of anti-reflective structure has been formed through etching which has been carried out using the reactive ion etching apparatus.

Figure 15A:
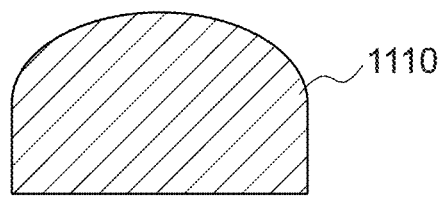
FIGS. 15A, 15B and 15C illustrate how a mold for anti-reflective structure is formed on a curved surface.
Figure 15B:
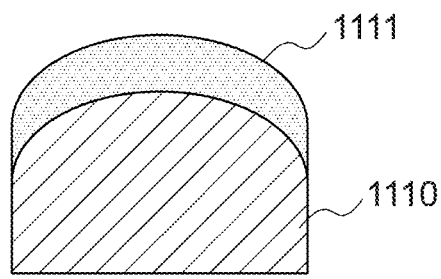
Figure 15C:
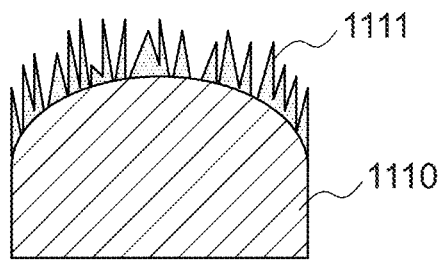

FIGS. 15A, 15B and 15C illustrate how a mold for anti-reflective structure is formed on a curved surface.

FIG. 15A shows a cross section of a mold core 1110 which is provided with a curved surface. The curved surface is formed by cutting, for example.

FIG. 15B shows a cross section of a mold core 1110 which is provided with a thin film 111 of base material formed on a surface of the core. The thin film 111 of base material is formed by sputtering, vapor deposition or the like.

FIG. 15C shows a cross section of a mold core which is obtained by forming a shape of anti-reflective structure on a surface of the thin film 1111 of the substrate of what is shown in FIG. 15B. The shape of anti-reflective structure has been formed through etching which has been carried out using the reactive ion etching apparatus. According to the method illustrated by FIGS. 15A, 15B and 15C, a mold for antireflective structure can be manufactured on any curved surfaces.

Figure 16:
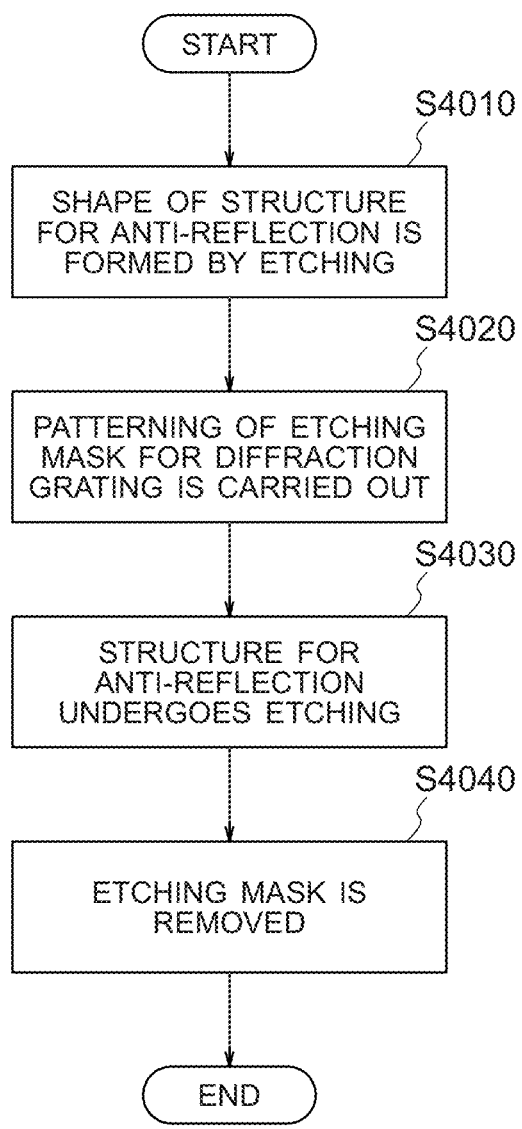
FIG. 16 is a flowchart for illustrating a method for manufacturing a mold for a diffraction grating provided with an anti-reflective structure.

FIG. 16 is a flowchart for illustrating a method for manufacturing a mold for a diffraction grating provided with an anti-reflective fine structure.

Figure 17A:
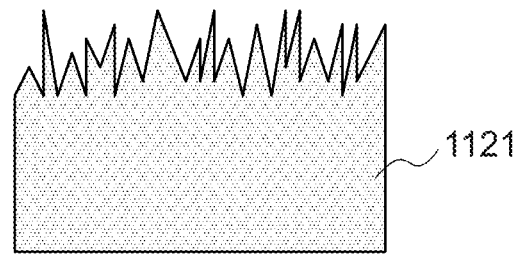
FIGS. 17A, 17B and 17C are diagrams for illustrating a method for manufacturing a mold for a diffraction grating provided with an anti-reflective structure.
Figure 17B:
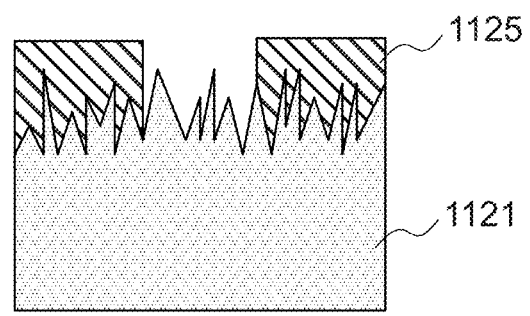
Figure 17C:
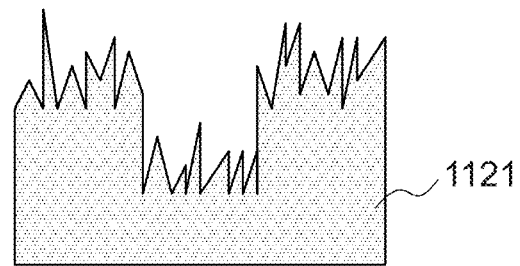

FIGS. 17A, 17B and 17C are diagrams for illustrating the method for manufacturing a mold for a diffraction grating provided with an anti-reflective fine structure.

In step S4010 in FIG. 16, a shape of anti-reflective structure is formed on a surface of a substrate 1121 through etching which is carried out using the reactive ion etching apparatus.

FIG. 17A shows a cross section of the substrate 1121 which has undergone etching.

In step S4020 in FIG. 16, on the surface of the substrate 1121, on which the shape of anti-reflective structure has been formed through etching which has been carried out using the reactive ion etching apparatus, a patterning of etching mask for a diffraction grating is carried out.

FIG. 17B shows a cross section of the substrate 1121, on a surface of which the patterning of an etching mask 1125 for the diffraction grating has been carried out. The patterning of the etching mask 1125 will be described later.

In step S4030 in FIG. 16, the substrate 1121, on a surface of which the patterning of the etching mask 1125 for the diffraction grating has been carried out is further made to undergo etching using the reactive ion etching apparatus.

In step S4040 in FIG. 16, the etching mask 1125 is removed. The removal of the etching mask 1125 will be described later.

FIG. 17C shows a cross section of a mold for a diffraction grating provided with an anti-reflective fine structure. The mold is manufactured by the method illustrated in the flowchart of FIG. 16.

Figure 18A:
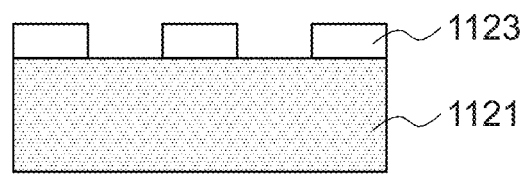
FIGS. 18A, 18B and 18C are diagrams for illustrating patterning of an etching mask.
Figure 18B:
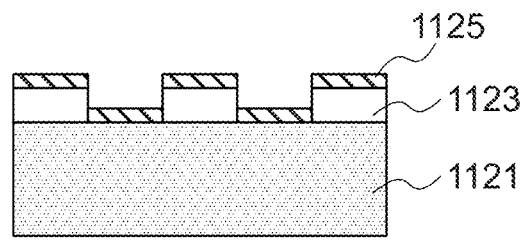
Figure 18C:
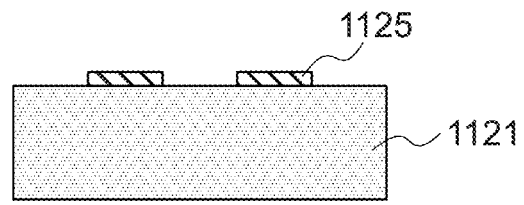

FIGS. 18A, 18B and 18C are diagrams for illustrating patterning of an etching mask.

FIG. 18A shows a cross section of a substrate 1121, on a surface of which patterning of a resist 1123 for a diffraction grating has been carried out.

FIG. 18B shows a cross section of the substrate 1121, on a surface of which patterning of the resist 1123 for the diffraction grating has been carried out and then a metal 1125 which is resistant to reaction with fluorine-containing gases, such as chromium and nickel has been deposited.

FIG. 18C shows a cross section of the substrate 121, on a surface of which patterning of the resist 1123 for the diffraction grating has been carried out, the metal 1125 which is resistant to reaction with fluorine-containing gases, such as chromium and nickel has been deposited and then the resist 1123 has been removed. The metal 1125 such as chromium and nickel, shown in FIG. 18C functions as the etching mask.

The resist 1123 shown in FIG. 18A can also be used as the etching mask. However, etch selectivity (a difference in etching rate) of the substrate against the resist is smaller than etch selectivity of the substrate against a metal such as chromium and nickel, and therefore depth of etching is smaller.

Figure 19:
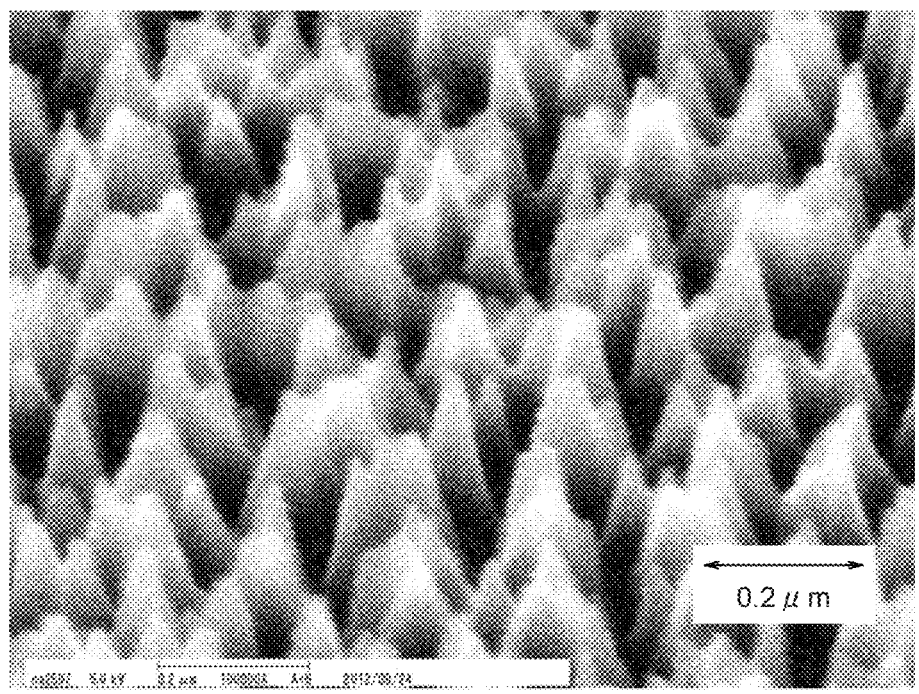
FIG. 19 shows a scanning electron microscope photo of a mold for anti-reflective structure manufactured by a method according to the present invention.

FIG. 19 shows a scanning electron microscope photo of a mold for anti-reflective structure manufactured by a method according to the present invention. The pitch of the fine structure of the anti-reflective structure is approximately 0.2 micrometers.

Figure 20:
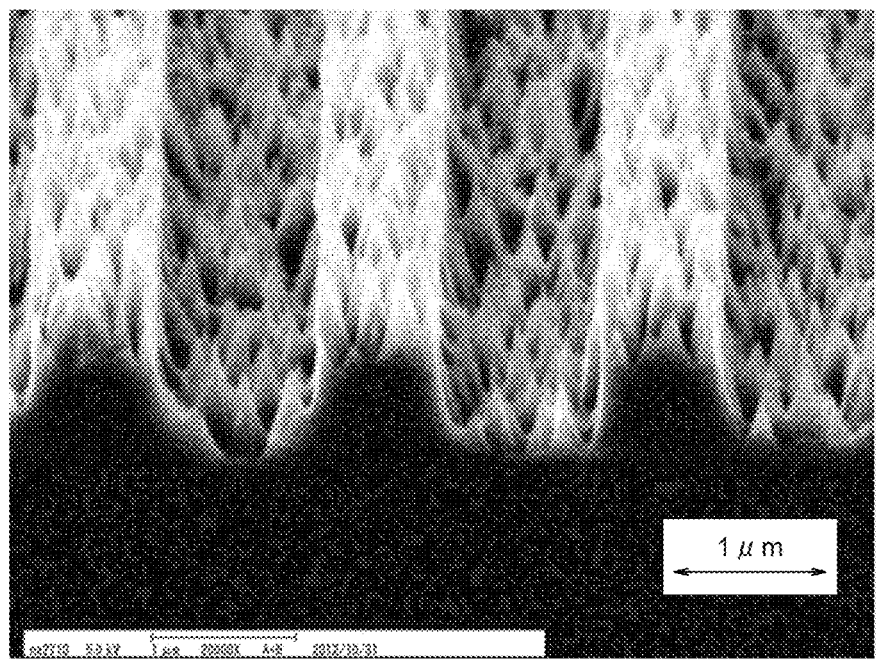
FIG. 20 shows a scanning electron microscope photo of a mold for a diffraction grating provided with an anti-reflective structure.

FIG. 20 shows a scanning electron microscope photo of a mold for a diffraction grating provided with an anti-reflective fine structure. The pitch of the diffraction grating is approximately 2 micrometers while the pitch of the fine structure of the anti-reflective structure is approximately 0.2 micrometers.

Figure 21:
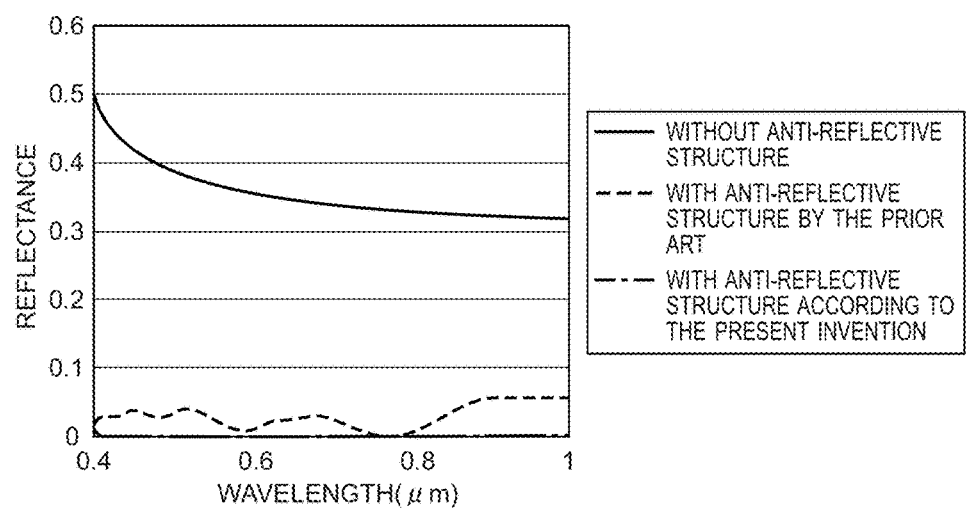
FIG. 21 shows relationships between reflectance and wavelength of a surface provided with an anti-reflective structure manufactured by the method according to the present invention, a surface provided with an anti-reflective structure manufactured by a method according to a prior art and a surface without an anti-reflective structure.

FIG. 21 shows relationships between reflectance and wavelength of a surface provided with an anti-reflective structure manufactured by the method according to the present invention, a surface provided with an anti-reflective structure manufactured by a method according to a prior art (a method using an electron beam lithography system) and a surface without an anti-reflective structure. The horizontal axis of FIG. 21 represents wavelength while the vertical axis of FIG. 21 represents reflectance. Reflectance of the surface provided with the anti-reflective structure manufactured by the method according to the present invention is smaller over the whole range of wavelength than the reflectance of the surface provided with the anti-reflective structure manufactured by the method according to a prior art. This demonstrates that an anti-reflective structure having higher performance can be manufactured according to the present invention.

By the method for manufacturing a mold for an antireflective structure according to the present invention, an anti-reflective structure having higher performance can be manufactured without the use of patterning. According to the present method, a mold for an anti-reflective structure of a large area can be manufactured without any other constrains than the area of the reactive etching apparatus. Further, according to the present method, a mold for an anti-reflective structure for molding an anti-reflective fine structure on any curved surface and a mold for an antireflective structure for molding a diffraction grating provided with an anti-reflective fine structure can be manufactured.

According to the present invention, a mold for an antireflective structure used for visible light and infrared rays, an optical element provided with an anti-reflective structure, and a mold for diffusing structure can be obtained without the necessity of patterning.

We claim:

1. A method for manufacturing, without the necessity of patterning process using a resist layer, a mold or an optical element provided with a fine surface roughness, the fine surface roughness having a pitch in a range of 3 to 18 micrometers, for anti-reflection or for diffusing, comprising:
   placing a substrate or a film made of a semiconductor or a metal into a reactive etching apparatus;
   introducing a mixed gas of sulfur hexafluoride and oxygen into the etching apparatus with the substrate or the film;
   tuning the mixed gas into plasma such that oxides are made to be scattered on a surface of the substrate or the film; and
   etching the surface of the substrate of the film by the sulfur hexafluoride while the oxides function as an etching mask to form the fine surface roughness on the surface of the substrate or the film,
   wherein etching conditions are determined such that the pitch of the fine surface roughness is made from 3 to 18 micrometers, and a ratio of depth to pitch of the fine surface roughness is determined by changing a ratio of an amount of feed of sulfur hexafluoride and an amount of feed of oxygen.

2. A method for manufacturing, without the necessity of patterning process using a resist layer, a mold or an optical element provided with a fine surface roughness, the fine surface roughness having a pitch in a range of 0.2 to 3 micrometers, for anti-reflection or for diffusing, comprising:

placing a substrate or a film made of a semiconductor or a metal into a reactive etching apparatus;

introducing a mixed gas of sulfur hexafluoride and oxygen into the etching apparatus with the substrate or the film;

tuning the mixed gas into plasma such that oxides are made to be scattered on a surface of the substrate or the film; and etching the surface of the substrate of the film by the sulfur hexafluoride while the oxides function as an etching mask to form the fine surface roughness on the surface of the substrate or the film, wherein etching conditions are determined such that the pitch of the fine surface roughness is made from 0.2 to 3 micrometers, and a ratio of depth to pitch of the fine surface roughness is determined by changing a ratio of an amount of feed of sulfur hexafluoride and an amount of feed of oxygen.

\* \* \* \* \*